(12) United States Patent
Um et al.

(10) Patent No.: US 10,770,688 B2
(45) Date of Patent: Sep. 8, 2020

(54) DISPLAY DEVICE

(71) Applicant: Samsung Display Co. Ltd., Yongin-si (KR)

(72) Inventors: Nu Ree Um, Hwaseong-si (KR); Sang Eun Moon, Suwon-si (KR); Jin Hee Jang, Gunpo-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/214,133

(22) Filed: Dec. 10, 2018

(65) Prior Publication Data

US 2019/0296265 A1 Sep. 26, 2019

(30) Foreign Application Priority Data

Mar. 26, 2018 (KR) .................. 10-2018-0034294

(51) Int. Cl.
  *H01L 51/52* (2006.01)
  *H01L 27/32* (2006.01)

(52) U.S. Cl.
  CPC ........ *H01L 51/5268* (2013.01); *H01L 27/323* (2013.01); *H01L 27/3244* (2013.01); *H01L 51/524* (2013.01); *H01L 2251/303* (2013.01); *H01L 2251/5369* (2013.01)

(58) Field of Classification Search
  CPC . H01L 27/323; H01L 27/3244; H01L 51/524; H01L 51/5268; H01L 51/5281; H01L 51/5284
  See application file for complete search history.

(56) References Cited

U.S. PATENT DOCUMENTS

| | | | | |
|---|---|---|---|---|
| 5,249,105 | A | * | 9/1993 | Koizumi ............... G02B 6/001 362/565 |
| 2016/0343992 | A1 | * | 11/2016 | Kim .................... H01L 51/5275 |
| 2017/0082789 | A1 | * | 3/2017 | Yasunaga ............. G02B 6/0068 |
| 2017/0155093 | A1 | * | 6/2017 | Jo .......................... G02B 7/021 |
| 2017/0343852 | A1 | * | 11/2017 | Park .................. G02F 1/133308 |
| 2018/0173044 | A1 | * | 6/2018 | Lim ..................... G02B 6/0085 |

FOREIGN PATENT DOCUMENTS

KR 10-2015-0072013 6/2015

* cited by examiner

*Primary Examiner* — Joseph M Galvin, III
(74) *Attorney, Agent, or Firm* — H.C. Park & Associates, PLC

(57) ABSTRACT

A display device including a display panel including a display area and a non-display area surrounding the display area; a window disposed above the display panel; a driving circuit chip disposed in the non-display area and mounted on the display panel; and a light-scattering member interposed between the display panel and the window. The light-scattering member overlaps with the driving circuit chip and contains scattering particles.

18 Claims, 9 Drawing Sheets

DISPLAY DEVICE

CROSS REFERENCE TO RELATED APPLICATION

This application claims priority from and the benefit of Korean Patent Application No. 10-2018-0034294, filed on Mar. 26, 2018, which is hereby incorporated by reference for all purposes as if fully set forth herein.

BACKGROUND

Field

Exemplary embodiments of the invention relate to a display device.

Discussion of the Background

Display devices become more and more important as multimedia technology evolves. Accordingly, a variety of types of display devices such as organic light-emitting display (OLED) devices and liquid-crystal display (LCD) devices are currently used.

A display device may include a display panel and a window disposed on the display panel to protect it. Portable tablet PCs and smart phones are not fixedly installed but are carried by users and thus, frequently exposed to the external environment. When such devices have a touch-sensing feature, external force is continuously applied thereto and thus, the function of the window is more important.

A window may be attached to a display panel by an adhesive member such as an optically clear resin (OCR). Typically, the adhesive member is applied onto the display panel, the window is disposed thereon, and ultraviolet light is irradiated onto it to cure the adhesive member, in order to couple the window with the display panel.

Ultraviolet (UV) light passes through the window to reach the adhesive member. The UV light may be blocked by a light-blocking pattern layer or the like disposed between the window and the adhesive member, such that a portion of the adhesive member may not be cured. The uncured portion of the adhesive member may overflow to cause failure of other elements for driving the display panel or may be seen from the outside to deteriorate the aesthetic quality. Further, since a portion of the adhesive member is not cured, the coupling force between the window and the display panel becomes weak, so that the window and the display panel may be easily detached from each other.

The above information disclosed in this Background section is only for understanding of the background of the inventive concepts, and, therefore, it may contain information that does not constitute prior art.

SUMMARY

Exemplary embodiments of the invention provide a display device with improved curing efficiency of an adhesive member.

Additional features of the inventive concepts will be set forth in the description which follows, and in part will be apparent from the description, or may be learned by practice of the inventive concepts.

An exemplary embodiment of the invention provides a display device. The display device includes: a display panel including a display area, and a non-display area surrounding the display area; a window disposed above the display panel; a driving circuit chip disposed in the non-display area and mounted on the display panel; and a light-scattering member interposed between the display panel and the window. The light-scattering member overlaps with the driving circuit chip and contains scattering particles.

The display device may further include: a light-blocking pattern layer disposed on a lower surface of the window and extended along the non-display area.

The display device may further include an adhesive member interposed between the window and the display panel and overlapping with an entire surface of the display area and a part of the non-display area.

The adhesive member may be an optically clear resin (OCR).

The light-scattering member may be in direct contact with the driving circuit chip and the light-blocking pattern layer.

The scattering particles may include at least one of $TiO_2$, $ZrO_2$, $ZnO$, $CeO_2$, $TaO_2$, and $SiO_2$.

The size of the scattering particles may range from 150 to 200 nm.

The light-scattering member may further include a binder layer in which the scattering particles are dispersed.

The content of the scattering particles may range from 0.1% to 20%.

The binder layer may include an ultraviolet curing agent.

The binder layer may be an epoxy resin or an acrylic resin.

The width of the light-scattering member may be less than a width of the driving circuit chip.

The display device may include a flexible circuit board disposed in the non-display area and disposed more to the outside than the driving circuit chip. The light-scattering member may or may not overlap with the flexible circuit board.

Another exemplary embodiment provides a display device including: a display panel including a display area, and a non-display area surrounding the display area; a window disposed above the display panel; an adhesive member interposed between the window and the display panel and overlapping an entire surface of the display area and a part of the non-display area; a driving circuit chip mounted on the display panel and disposed in the non-display area; and a light-scattering tape disposed on the window. The light-scattering tape faces the display panel and overlaps with the driving circuit chip.

The light-scattering tape may contain scattering particles.

The scattering particles may include at least one of $TiO_2$, $ZrO_2$, $ZnO$, $CeO_2$, $TaO_2$, and $SiO_2$.

The size of the scattering particles may range from 150 to 200 nm.

The width of the light-scattering tape may be greater than a width of the driving circuit chip.

The adhesive member may be an optically clear resin (OCR).

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
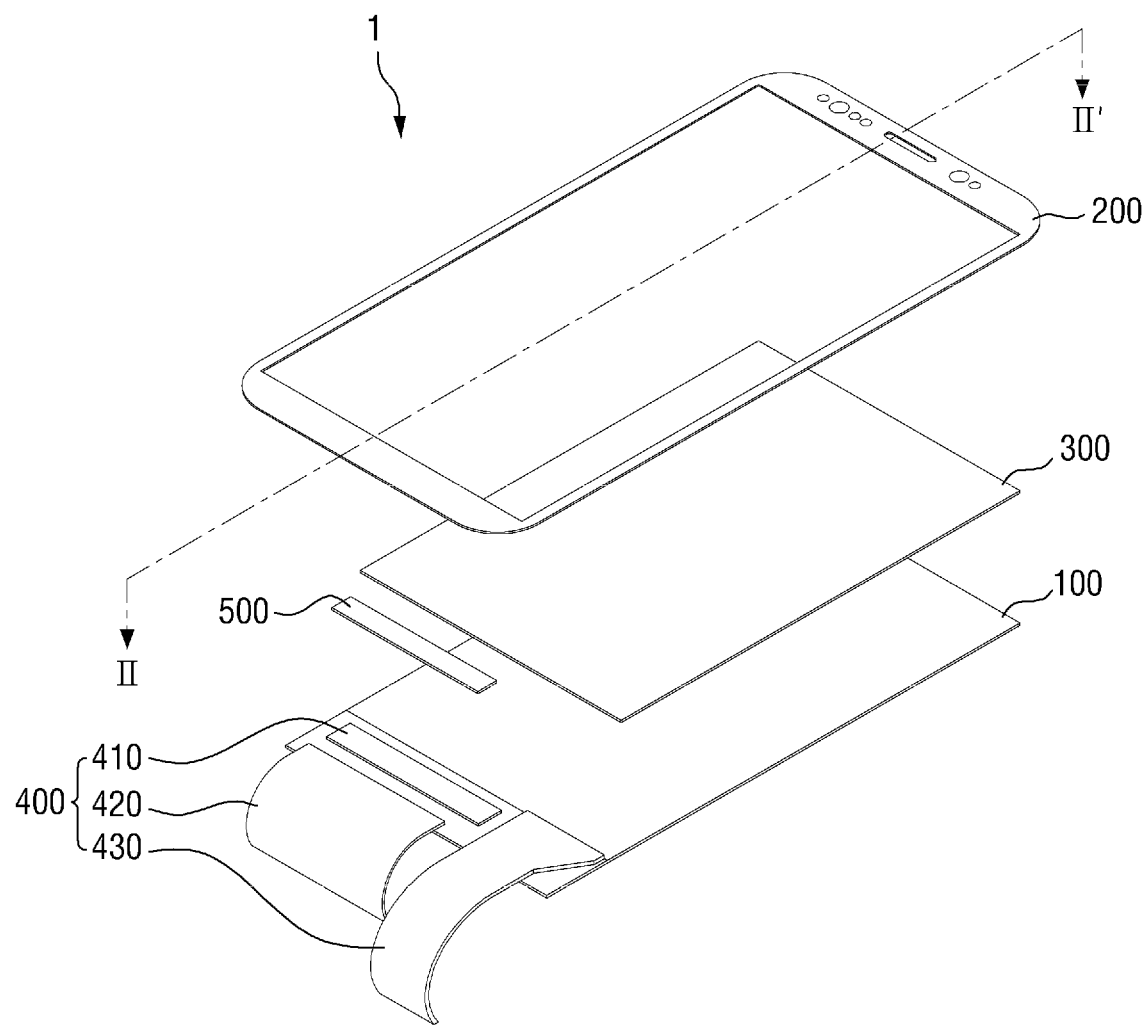
FIG. 1 is an exploded, perspective view of a display device according to an exemplary embodiment of the Invention.

In the following description, for the purposes of explanation, numerous specific details are set forth in order to provide a thorough understanding of various exemplary embodiments of the invention. As used herein "embodiments" are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Display devices are configured to display moving images or still images. A display device may be used as the display screen of portable electronic devices such as a mobile phone, a smart phone, a tablet PC, a smart watch, a watch phone, a mobile communications terminal, an electronic notebook, an electronic book, a portable multimedia player (PMP), a navigation device and a ultra mobile PC (UMPC), as well as the display screen of various products such as a television, a notebook, a monitor, a billboard and the Internet of Things. Examples of display devices include an organic light-emitting display (OLED) device, a liquid-crystal display (LCD) device, a plasma display device (PDP), a field emission display (FED) device, an electrophoretic display (EPD) device, etc.

In the following description, an organic light-emitting display device will be described as an example of display devices. It is, however, to be understood that the inventive concepts are not limited thereto.

Figure 2:
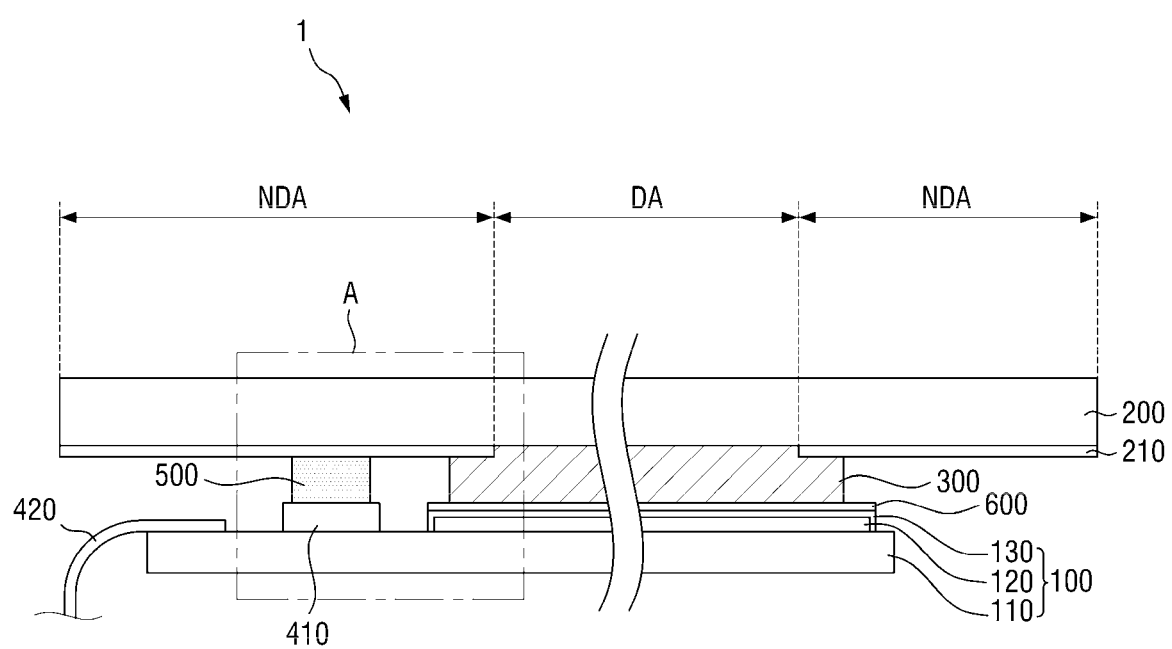
FIG. 2 is a cross-sectional view taken along line II-II' of FIG. 1.

FIG. 1 is an exploded, perspective view of a display device according to an exemplary embodiment of the invention. FIG. 2 is a cross-sectional view taken along line II-II' of FIG. 1.

Referring to FIGS. 1 and 2, a display device 1 includes a display area DA and a non-display area NA disposed around the display area DA. The non-display area NDA may form the edge of the display device 1. For example, when the display area DA has a rectangular shape, the non-display area NDA may be disposed along the four sides of the display area DA.

The display device 1 includes a display panel 100, a window 200 disposed above the display panel 100 to overlap the display panel 100, and an adhesive member 300 interposed between the display panel 100 and the window 200. As used herein, the terms "top" and "upper surface" refer to the side of the display panel 100 in which images are displayed, whereas the terms "bottom" and "lower surface" refer to the opposite side of the display panel 100, unless stated otherwise.

The display panel 100 is an organic light-emitting display panel and may include a substrate 110 and a plurality of organic light-emitting elements 120 disposed on the substrate 110.

The substrate 110 supports the organic light-emitting elements 120. The substrate 110 may be made of an insulating material. The substrate 110 may be formed of an inorganic material such as glass and quartz, or may be formed of an organic material such as polyimide. The substrate 110 may be either a rigid substrate or a flexible substrate.

The organic light-emitting elements 120 are disposed on the substrate 110. Each of the organic light-emitting elements 120 may include a thin-film transistor (TFT) and an organic light-emitting diode (OLED). The thin-film transistor TFT includes a semiconductor layer PS, a gate electrode GE, a source electrode SE, and a drain electrode DE. The organic light-emitting diode OLED includes an anode electrode ANO, a cathode electrode CAT, and an organic layer EL disposed therebetween.

The plurality of organic light-emitting elements 120 may be sealed by a passivation layer 130. The passivation layer 130 contains an inorganic material. The passivation layer 130 may include a stack of multiple layers. For example, the passivation layer 130 may include a first inorganic material layer, an organic material layer, and a second inorganic material layer stacked on one another sequentially.

A touch sensing member (not shown) including a touch electrode may be disposed on the passivation layer 130. However, the inventive concepts are not limited thereto. A separate touch panel may be disposed between the display panel 100 and the window 200.

A polarizing film 600 may be disposed on the passivation layer 130. The polarizing film 600 may be disposed between the display panel 100 and the window 200 to reduce reflection of external light.

A driving unit 400 for driving a pixel circuit of the display area DA may be disposed on one side of the display panel 100. Specifically, the driving unit 400 may be disposed on one side of the non-display area NDA adjacent to the display area DA.

The driving unit 400 may include a driving circuit chip 410, and flexible circuit boards 420 and 430 for transmitting a driving signal.

The driving circuit chip 410 drives the display panel 100 and may be mounted on the substrate 110. The driving circuit chip 410 may have a box shape having a predetermined width and height, and may be disposed to protrude toward the window 200 from the upper surface of the substrate 110.

The flexible circuit boards 420 and 430 may include a first flexible circuit board 420 for providing a signal for driving the organic light-emitting elements of the display panel 100, and a second flexible circuit board 430 for providing a signal for driving the touch sensing member. The second flexible circuit board 430 may be electrically connected to the first flexible circuit board 420.

A light-scattering member 500 may be disposed on the driving circuit chip 410. The light-scattering member 500 scatters ultraviolet (UV) light incident from the side of the display device 1 to facilitate the ultraviolet (UV) light to reach the adhesive member 300. A detailed description thereof will be described below with reference to FIG. 3.

The window 200 is disposed above the display panel 100 and overlaps it. The window 200 protects the display panel 100 from an external impact while transmitting light exiting from the display panel 100.

The window 200 may be disposed to overlap the display panel 100 and cover the entire surface of the display panel 100. The window 200 may be larger than the display panel 100. For example, the window 200 may protrude outwardly from two shorter sides and two longer sides of the display device 1.

The window 200 may include a transparent glass or a transparent material such as polyethylene terephthalate, polyvinyl resin and polyester. However, the inventive concepts are not limited thereto. The type of the window 200 is not particularly limited herein as long as it has a sufficient transmittance to transmit the light exiting from the display panel 100.

A light-blocking pattern layer 210 may be disposed on the lower surface of the window 200. The light-blocking pattern layer 210 absorbs or reflects light incident from the upper surface and/or the lower surface of the window 200, and provides colors to the bezel of the display device 1.

The light-blocking pattern layer 210 may be continuously disposed along the non-display area NDA. In other words, the light-blocking pattern layer 210 may be continuously disposed along the edge of the display area DA.

The light-blocking pattern layer 210 may be formed by coating a color ink onto the window 200, or may be formed as a film and then attached to the window 200 by an adhesive member. It is, however, to be understood that the way of forming the light-blocking pattern layer 210 is not limited thereto. It may be formed by any of a variety of ways known in the art.

The adhesive member 300 may be interposed between the window 200 and the display panel 100 for coupling them. For example, the adhesive member 300 may be formed as an optically clear resin (OCR). When the polarizing film 600 is disposed on the display panel 100, the adhesive member 300 may be interposed between the polarizing film 600 and the window 200.

The adhesive member 300 is disposed on the entire surface of the display area DA, and may be extended outward and disposed in a part of the non-display area NDA. The adhesive member 300 may overlap a part of the light-blocking pattern layer 210 adjacent to the display area DA. For example, the adhesive member 300 may come in direct contact with the lower surface of the window 200 in the display area DA and may come in direct contact with the light-blocking pattern layer 210 in the non-display area NDA.

Typically, an optically clear resin (OCR) is formed on the display panel 100 as the adhesive member 300, the window 200 is laminated thereon, and ultraviolet (UV) light is irradiated to cure the adhesive member 300, so that the window 200 and the display panel 100 can be coupled with each other.

More specifically, the optically clear resin (OCR) may be slit-coated on a surface of the display panel 100 as the adhesive member 300, and ultraviolet (UV) light is irradiated thereon to cure it preliminarily. Subsequently, the display panel 100 and the window 200 are laminated together, and then ultraviolet (UV) light is irradiated through the upper surface of the window 200 to finally cure the optically clear resin (OCR).

A part of the ultraviolet (UV) light irradiated through the upper surface of the window 200 may be blocked by the light-blocking pattern layer 210. Accordingly, a portion of the adhesive member 300 overlapping the light-blocking pattern layer 210 may not be cured by the ultraviolet (UV) light, leaving the optically clear resin (OCR) uncured. In an exemplary embodiment, the edge of the adhesive member 300 may be an uncured portion of the optically clear resin (OCR).

The uncured portion of the optically clear resin (OCR) may overflow into the driving circuit chip 410, the first flexible circuit board 420, or the second flexible circuit board 430, to thereby cause a failure. In addition, it may be seen from the outside such that the aesthetic quality of the display device 1 may be deteriorated. In addition, since the coupling force of the adhesive member 300 is generally proportional to its area, if there is an uncured portion, the adhesive area decreases and the coupling force decreases. As a result, the window 200 and the display panel 100 may be easily detached from each other.

In order to cure the optically clear resin (OCR) overlapping with the light-blocking pattern layer 210, ultraviolet (UV) light may be irradiated from the side of the display device 1. At two longer sides and one shorter side of the display device 1 where the driving unit 400 is not disposed, the distance that the ultraviolet (UV) light reaches the optically clear resin (OCR), i.e., the exposure distance is relatively short, and thus, the optically clear resin (OCR) overlapping the light-blocking pattern layer 210 can be cured by exposure from the side. On the other hand, at one shorter side where the driving unit 400 is disposed, the exposure distance of ultraviolet (UV) light is relatively long and the driving circuit chip 410 is disposed on the exposure path. Accordingly, the amount of the ultraviolet (UV) light reaching the optically clear resin (OCR) is relatively small. That is to say, at the shorter side where the driving unit 400 is disposed, a portion of the optically clear resin (OCR) that was not cured during the final curing process may not be cured even by performing the exposure from the side.

In contrast, when the light-scattering member 500 is disposed so that it overlaps the driving circuit chip 410, the amount of ultraviolet (UV) light reaching the optically clear resin (OCR) overlapping with the light-blocking pattern layer 210 increases, and accordingly, the curing efficiency of the optically clear resin (OCR) can be increased. More detailed descriptions thereof will be given with reference to FIG. 3.

Figure 3:
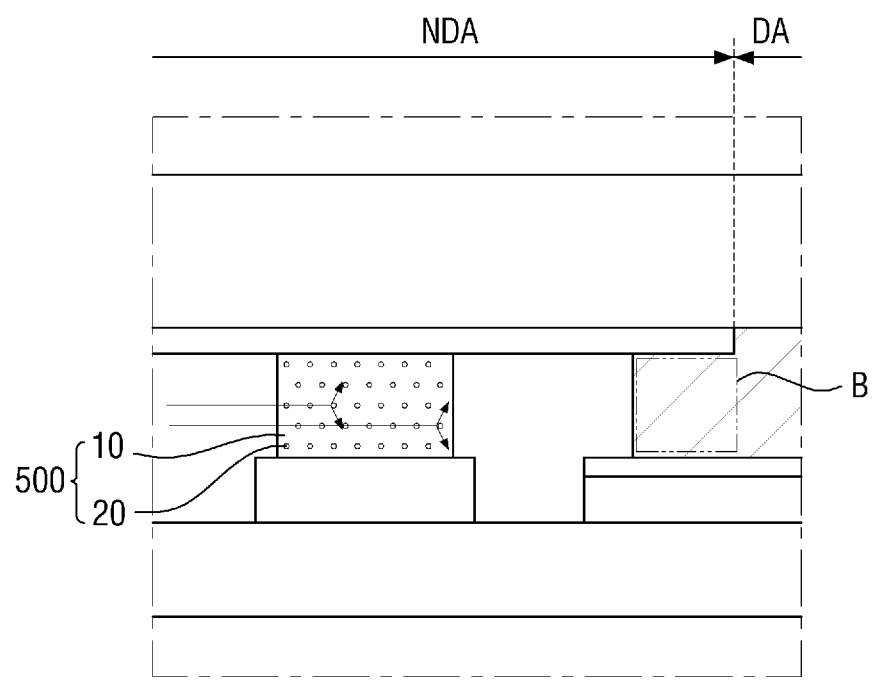
FIG. 3 is an enlarged cross-sectional view of area A of FIG. 2.

FIG. 3 is an enlarged, cross-sectional view of portion A of FIG. 2.

Referring to FIG. 3, the light-scattering member 500 may be disposed on the driving circuit chip 410.

The light-scattering member 500 facilitates the traveling of the ultraviolet (UV) light irradiated through the side surface of the display device 1, allowing a greater amount of the ultraviolet (UV) light to reach a region B where the light-blocking pattern layer 210 overlaps with the adhesive member 300.

In an exemplary embodiment, the light-scattering member 500 completely overlaps with the driving circuit chip 410, and the side surfaces of the light-scattering member 500 may be disposed within the driving circuit chip 410. However, the inventive concepts are not limited thereto. The side surfaces of the light-scattering member 500 may be substantially aligned with the side surfaces of the driving circuit chip 410.

The light-scattering member 500 may contain a binder layer 10 and scattering particles 20 dispersed in the binder layer 10.

The binder layer 10 is a medium in which the scattering particles 20 are dispersed, and may be made of various resin compositions, which may be generally referred to as binders. In an exemplary embodiment, the binder layer 10 may be an ultraviolet curing agent, such as an acrylic resin and an epoxy resin and may work as an adhesive member.

As the binder layer 10 works as an adhesive member, the display panel 100 is coupled with the window 200 not only by the adhesive member 300 but also by the binder layer 10, so that the coupling between the display panel 100 and the window 200 can be reinforced. In this manner, the probability that the display panel 100 is detached from the window 200 can be decreased, and the durability of the display device 1 can be increased.

The scattering particles 20 scatter the ultraviolet (UV) light passing through the light-scattering member 500 to facilitate a more amount of ultraviolet light to reach the optically clear resin (OCR).

The scattering particles 20 may be, for example, $TiO_2$, $ZrO_2$, ZnO, $CeO_2$, $TaO_2$, $SiO_2$ and the like. The scattering particles 20 may be composed of a single kind of scattering particles or may include a various kinds of scattering particles.

The light-scattering member 500 may contain 0.1% to 20% of scattering particles 20 in the binder layer 10.

When the content of the scattering particles 20 is equal to or greater than 0.1%, a sufficient amount of ultraviolet (UV) light can reach for curing the adhesive member 300 in the region B overlapping with the light-blocking pattern layer 210.

Although the amount of ultraviolet (UV) light reaching the adhesive member 300 increases in proportion to the scattering particles 20, the cost for the material increases. In addition, as mentioned earlier, when the binder layer 10 works as the adhesive member, the coupling force between the display panel 100 and the window 200 may become weaker if the proportion of the binder layer 10 is relatively decreased. The scattering particles 20 may be equal to or less than 20%, taking into account the coast for the material and the adhesion performance.

The size of the scattering particles 20 may range from 70 nm to 200 nm. The size of the scattering particles 20 may further range from 150 nm to 200 nm. Typically, the smaller the size of the scattering particles 20 is, the greater the reflection and transmittance of ultraviolet (UV) light are.

Figure 4:
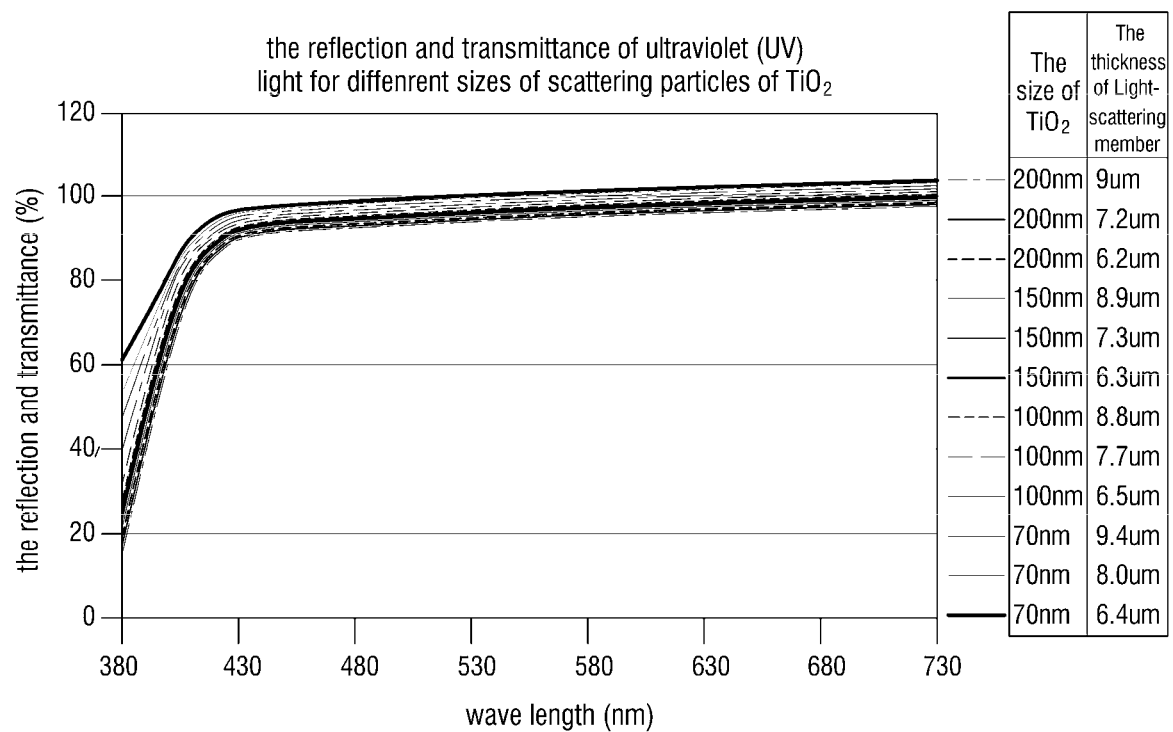
FIG. 4 is a graph showing the reflection and transmittance of ultraviolet (UV) light for different sizes of scattering particles of $TiO_2$.

FIG. 4 is a graph showing the reflection and transmittance of ultraviolet (UV) light for different sizes of scattering particles of $TiO_2$.

It can be seen from the graph shown in FIG. 4 that the reflection and transmittance (%) of ultraviolet (UV) light increase as the size of the scattering particles 20 decreases from 200 nm to 70 nm. That is, as the size of the scattering particles 20 becomes smaller, the reflection and transmittance (%) of the ultraviolet ray (UV) increases, so that a greater amount of ultraviolet (UV) light passing through the light-scattering member 500 can reach the region B of the adhesive member 300.

When the size of the scattering particles 20 is equal to or less than 200 nm, a sufficient amount of ultraviolet (UV) light can reach for curing the adhesive member 300 in the region B overlapping with the light-blocking pattern layer 210.

The lower limit of the size of the scattering particles 20 is not particularly limited herein. However, as the size of the scattering particles 20 decreases, the cost for the material exponentially increases. Accordingly, the size of the scattering particles 20 may be equal to or greater than 70 nm. Considering economical efficiency, and the reflection and transmittance, the size of the scattering particles 20 may be equal to or greater than 150 nm.

The size and mixing ratio of the scattering particles 20 may be controlled by the exposure distance of ultraviolet (UV) light and the size of the driving circuit chip 410 disposed on the exposure path.

Hereinafter, a display device according to another exemplary embodiment of the present disclosure will be described. In the following description, the same or similar elements will be denoted by the same or similar reference numerals, and redundant descriptions will be omitted or briefly described. Descriptions will be made focusing on differences from the above exemplary embodiment.

Figure 5:
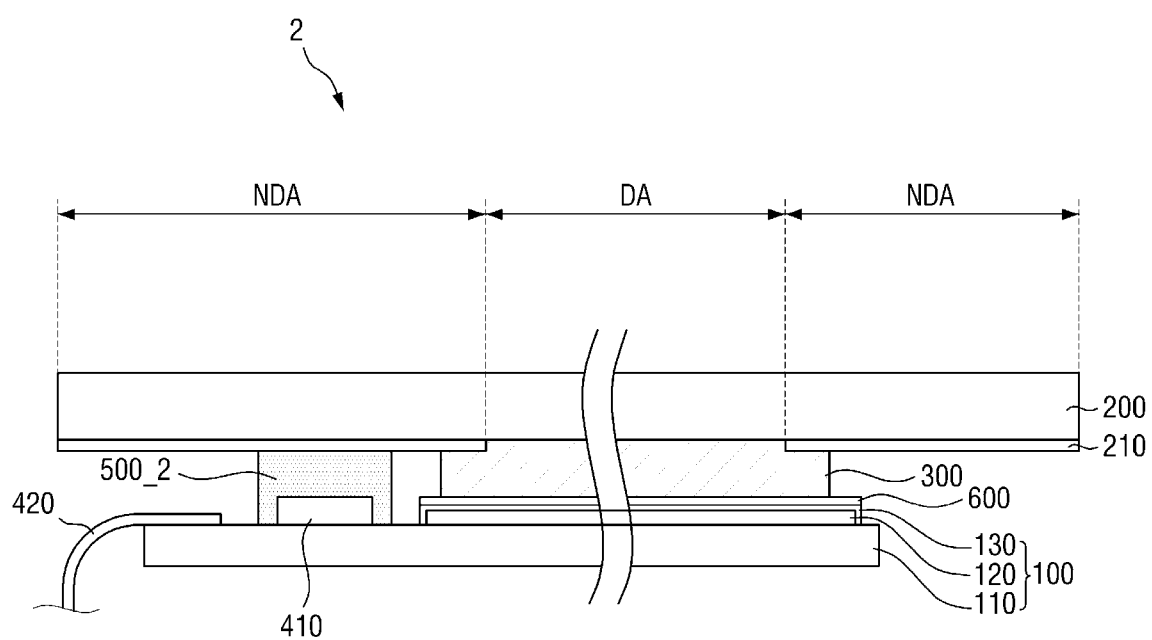
FIG. 5 is a cross-sectional view of a display device according to another exemplary embodiment of the invention.

FIG. 5 is a cross-sectional view of a display device according to another exemplary embodiment of the invention.

Referring to FIG. 5, a light-scattering member 500_2 of the display device 2 may completely cover the driving circuit chip 410.

The inner side surface of the light-scattering member 500_2 may be disposed more to the inside than the inner side surface of the driving circuit chip 410, and the outer side surface of the light-scattering member 500_2 may be disposed more to the outside than the outer side surface of the driving circuit chip 410.

That is to say, the two side surfaces of the light-scattering member 500_2 may be disposed on the substrate 110.

As the area of the light-scattering member 500_2 becomes larger, the coupling between the display panel 100 and the window 200 can be reinforced. In addition, the probability that the ultraviolet (UV) light strikes the scattering particles 20 increases, such that the amount of ultraviolet (UV) light reaching the adhesive member 300 can be increased.

As the area of the light-scattering member 500_2 increases, the size of the scattering particles 20 can become larger. That is to say, when the area of the light-scattering member 500_2 increases while the proportion of the scattering particles 20 per unit area in the light-scattering member 500_2 is maintained, the overall proportion of the scattering particles 20 increases. Accordingly, the transmittance of the ultraviolet (UV) light by the light-scattering member 500_2 can be maintained even when the size of the scattering particles 20 is increased.

Figure 6:
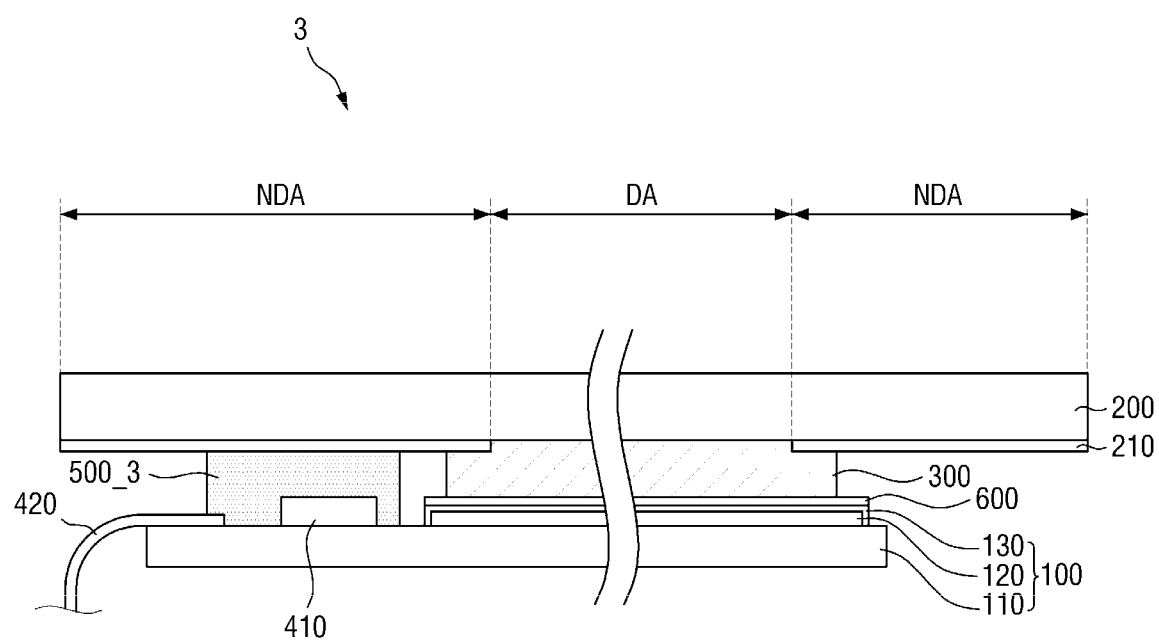
FIGS. 6 and 7 are cross-sectional views of display devices according to other exemplary embodiments of the invention.
Figure 7:
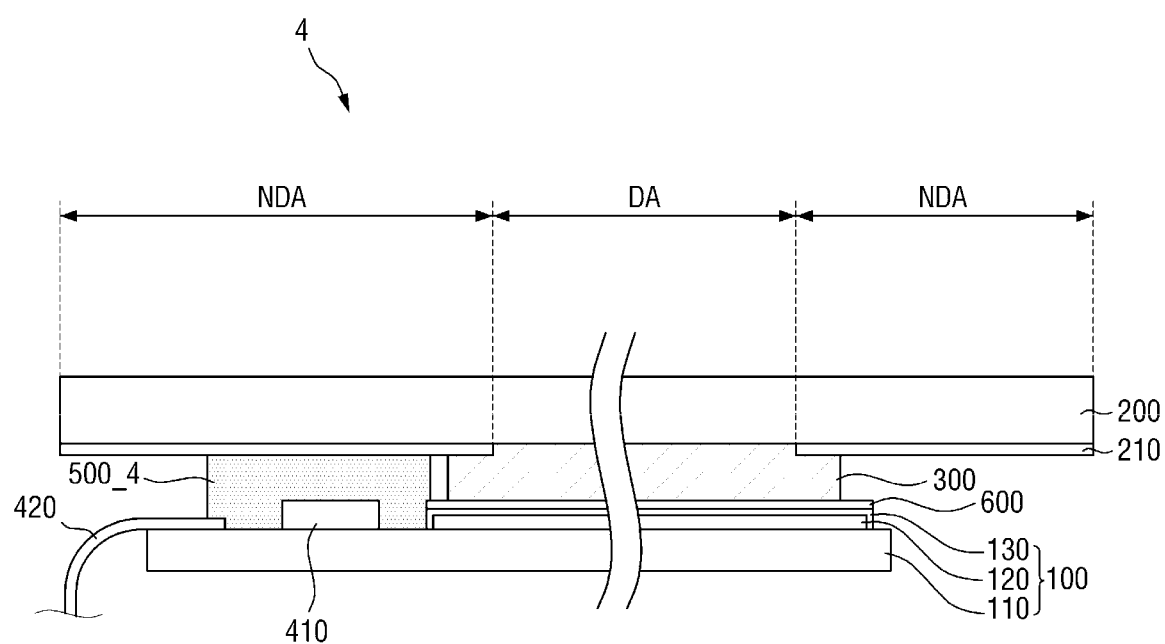

FIGS. 6 and 7 are cross-sectional views of display devices according to other exemplary embodiments of the invention.

Referring to FIG. 6, a light-scattering member 500_3 of a display device 3 may overlap a part of a first flexible circuit board 420. Referring to FIG. 7, a light-scattering member 500_4 of a display device 4 may overlap a first flexible circuit board 420 and a polarizing film 600.

The light-scattering member 500_3; 500_4 can work as an adhesive member as described above. Accordingly, as the area of the light-scattering member 500_3; 500_4 increases, the coupling force between the display panel 100 and the window 200 increases, so that the durability of the display device 3; 4 can be improved.

When the light-scattering member 500_3; 500_4 is disposed to cover the first flexible circuit board 420, it is possible to prevent the first flexible circuit board from being separated from the substrate 110.

Figure 8:
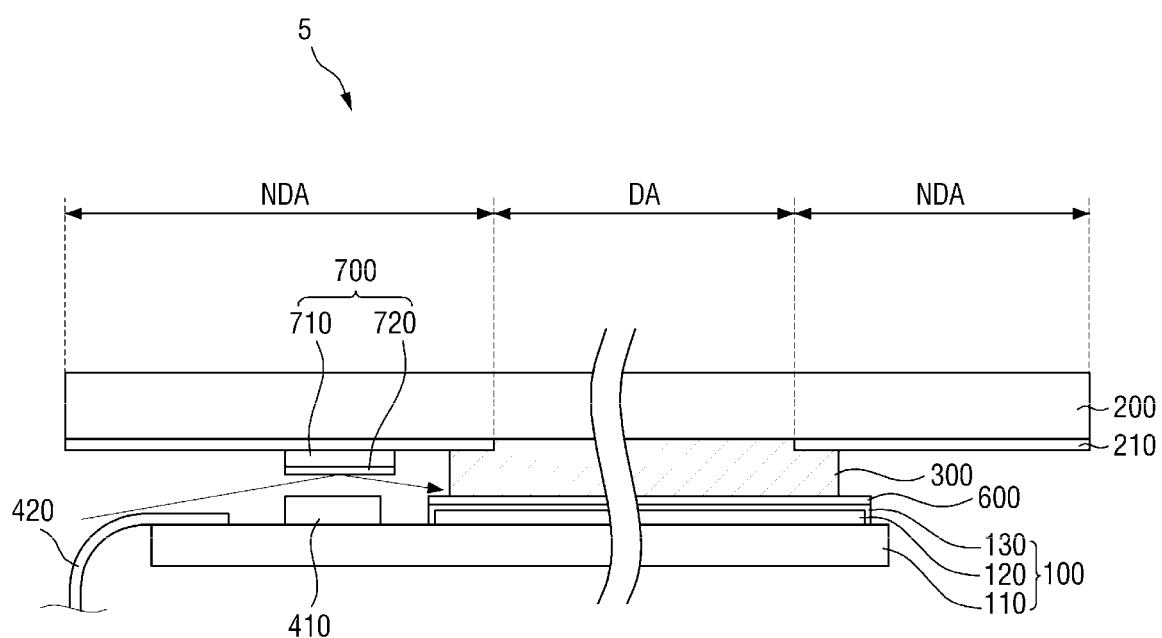
FIG. 8 is a cross-sectional view of a display device according to yet another exemplary embodiment of the invention.

FIG. 8 is a cross-sectional view of a display device according to yet another exemplary embodiment of the invention.

Referring to FIG. 8, a display device 5 may include a light-scattering tape 700.

The light-scattering tape 700 is disposed on the lower surface of a light-blocking pattern layer 210 and overlaps with a driving circuit chip 410.

The light-scattering tape 700 may include a base layer 710 having an adhesive force and an optical layer 720 containing scattering particles. The light-scattering tape 700 may contain scattering particles identical to the scattering particles 20 of the light-scattering member 500 described above. That is to say, the optical layer 720 may include $TiO_2$, $ZrO_2$, ZnO, $CeO_2$, $TaO_2$, $SiO_2$, and the like.

Similar to the light-scattering member 500, the light-scattering tape 700 scatters and reflects ultraviolet (UV) light incident from the side of the display device 5 to increase the amount of the ultraviolet (UV) light reaching the side surface of an adhesive member 300. Accordingly, a sufficient amount of ultraviolet (UV) light can reach the adhesive member 300 overlapping with the light-blocking pattern layer 210 through the exposure from the side, and the curing efficiency of the adhesive member 300 can be improved.

Figure 9:
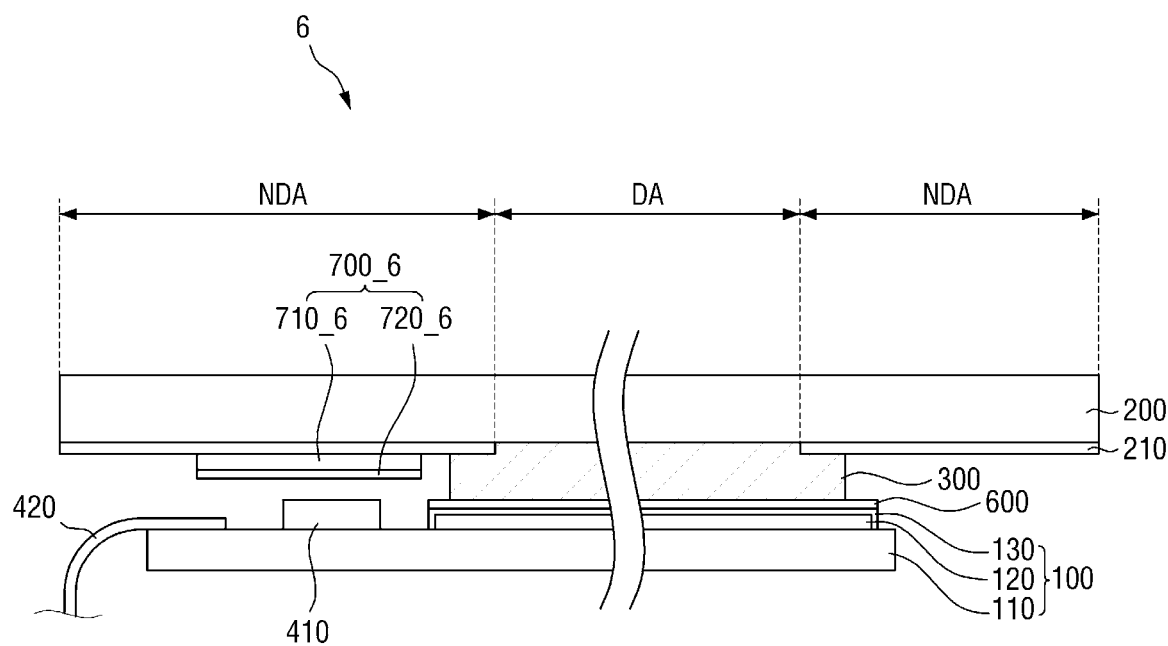
FIG. 9 is a cross-sectional view of a display device according to yet another exemplary embodiment of the invention.

FIG. 9 is a cross-sectional view of a display device according to yet another exemplary embodiment of the invention.

Referring to FIG. 9, a display device 6 includes a light-scattering tape 700_6 which overlaps with a first flexible circuit board 420 in the cross-sectional view.

As the area of the light-scattering tape 700_6 increases, the amount of ultraviolet (UV) light reflected or scattered by the light-scattering tape 700_6 increases, so that the amount of the ultraviolet (UV) light reaching the adhesive member 300 is also increased. As a result, the curing efficiency of the adhesive member 300 can be increased.

According to exemplary embodiments of the present disclosure, by disposing a light-scattering member in at least a region between a window and a display panel, the amount of ultraviolet (UV) light reaching the adhesive member can be increased, so that the curing efficiency of the adhesive member can be improved.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a display panel comprising a display area and a non-display area surrounding the display area;
a window disposed above the display panel;
a driving circuit chip disposed in the non-display area and mounted on the display panel; and
a light-scattering member interposed between the display panel and the window,
wherein:
the light-scattering member overlaps with the driving circuit chip and contains scattering particles; and
the light-scattering member is in direct contact with the driving circuit chip.

2. The display device of claim 1, further comprising a light-blocking pattern layer disposed on a lower surface of the window and extended along the non-display area.

3. The display device of claim 2, further comprising an adhesive member interposed between the window and the display panel and overlapping with an entire surface of the display area and a portion of the non-display area.

4. The display device of claim 3, wherein the adhesive member is an optically clear resin (OCR).

5. The display device of claim 2, wherein the light-scattering member is in direct contact with the light-blocking pattern layer.

6. The display device of claim 2, wherein the scattering particles comprise at least one of $TiO_2$, $ZrO_2$, ZnO, $CeO_2$, $TaO_2$, and $SiO_2$.

7. The display device of claim 6, wherein a size of the scattering particles ranges from 150 to 200 nm.

8. The display device of claim 1, wherein the light-scattering member further comprises a binder layer in which the scattering particles are dispersed.

9. The display device of claim 8, wherein a content of the scattering particles ranges from 0.1% to 20%.

10. The display device of claim 8, wherein the binder layer comprises an ultraviolet curing agent.

11. The display device of claim 10, wherein the binder layer is an epoxy resin or an acrylic resin.

12. A display device comprising:
a display panel comprising a display area and a non-display area surrounding the display area;
a window disposed above the display panel;
a driving circuit chip disposed in the non-display area and mounted on the display panel; and
a light-scattering member interposed between the display panel and the window,
wherein:
the light-scattering member overlaps with the driving circuit chip and contains scattering particles; and
a width of the light-scattering member is less than a width of the driving circuit chip.

13. A display device-comprising:
a display panel comprising a display area and a non-display area surrounding the display area;
a window disposed above the display panel;
a driving circuit chip disposed in the non-display area and mounted on the display panel;
a light-scattering member interposed between the display panel and the window; and
a flexible circuit board disposed in the non-display area and disposed more to the outside than the driving circuit chip,
wherein:
the light-scattering member overlaps with the driving circuit chip and contains scattering particles; and
the light-scattering member does not overlap with the flexible circuit board.

14. The display device of claim 1, comprising a flexible circuit board disposed in the non-display area and disposed more to the outside than the driving circuit chip,
wherein the light-scattering member overlaps with the flexible circuit board.

15. The display device of claim 13, wherein the scattering particles comprise at least one of $TiO_2$, $ZrO_2$, ZnO, $CeO_2$, $TaO_2$, and $SiO_2$.

16. The display device of claim 15, wherein a size of the scattering particles ranges from 150 to 200 nm.

17. The display device of claim 13, wherein a width of the light-scattering member is greater than a width of the driving circuit chip.

18. The display device of claim 13, further comprising an adhesive member interposed between the window and the display panel, wherein the adhesive member is an optically clear resin (OCR).

* * * * *